United States Patent
Guyette et al.

(10) Patent No.: US 10,411,319 B2
(45) Date of Patent: Sep. 10, 2019

(54) BANDSTOP FILTERS WITH POWER-DEPENDENT STOPBAND ATTENUATION

(71) Applicant: The Government of the United States of America, as represented by the Secretary of the Navy, Arlington, VA (US)

(72) Inventors: Adrew C. Guyette, San Mateo, CA (US); Eric J. Naglich, Alexandria, VA (US)

(73) Assignee: The Government of the United States of America, as represented by the Secretary of the Navy, Washington, DC (US)

( * ) Notice: Subject to any disclaimer, the term of this patent is extended or adjusted under 35 U.S.C. 154(b) by 110 days.

(21) Appl. No.: 15/720,741

(22) Filed: Sep. 29, 2017

(65) Prior Publication Data

US 2019/0103645 A1    Apr. 4, 2019

(51) Int. Cl.
| | |
|---|---|
| H01P 1/20 | (2006.01) |
| H03H 7/12 | (2006.01) |
| H01P 1/00 | (2006.01) |
| H03H 19/00 | (2006.01) |
| H03H 7/01 | (2006.01) |
| H01P 1/203 | (2006.01) |
| H03H 11/04 | (2006.01) |

(52) U.S. Cl.
CPC ............... *H01P 1/20* (2013.01); *H01P 1/005* (2013.01); *H01P 1/20381* (2013.01); *H03H 7/0153* (2013.01); *H03H 7/12* (2013.01); *H03H 19/002* (2013.01); *H03H 2007/013* (2013.01); *H03H 2011/0488* (2013.01)

(58) Field of Classification Search
CPC .. H03H 2007/013; H03H 7/12; H03H 7/0153; H01P 1/20
USPC ................................................. 333/17.1, 176
See application file for complete search history.

(56) References Cited

U.S. PATENT DOCUMENTS

| | | | | |
|---|---|---|---|---|
| 2,580,968 A | * | 1/1952 | Sproull ................... | G01R 23/04 324/636 |
| 2,679,585 A | * | 5/1954 | Drazy ...................... | H03D 9/04 329/322 |
| 3,546,633 A | * | 12/1970 | Peppiatt ................... | H01P 1/15 333/103 |

(Continued)

OTHER PUBLICATIONS

Naglich, Eric J. et al., "Switchless Tunable Bandstop-to-All-Pass Reconfigurable Filter," Microwave Theory and Techniques, IEEE Transactions, vol. 60, No. 5, pp. 1258-1265, May 2012.

(Continued)

*Primary Examiner* — Rakesh B Patel
(74) *Attorney, Agent, or Firm* — US Naval Research Laboratory; William P. Ladd

(57) ABSTRACT

Systems and method are provided for implementing filters whose response automatically and continuously reconfigures between an all-pass response and a bandstop response as the power level of signals within their bandwidth changes. Embodiments of the present disclosure allow high power signals within a designable bandwidth to be strongly attenuated while minimally affecting signals in adjacent bandwidths and further allow low power signals in the designable bandwidth to pass with minimal attenuation.

20 Claims, 8 Drawing Sheets

(56) References Cited

U.S. PATENT DOCUMENTS

| | | | |
|---|---|---|---|
| 4,940,956 A * | 7/1990 | Garner | H01P 7/06 333/209 |
| 2004/0120418 A1* | 6/2004 | Pasternak | H01Q 1/125 375/272 |
| 2016/0126929 A1* | 5/2016 | Leipold | H03H 7/463 333/132 |

OTHER PUBLICATIONS

Guyette, A.C., "Theory and Design of Intrinsically Switched Multiplexers With Optimum Phase Linearity," Microwave Theory and Techniques, IEEE Transactions, vol. 61, No. 9, pp. 3254-3264, Sep. 2013.

Guyette et al., "Power-dependent bandstop filters for frequency-selective limiting," 2016 IEEE MTT-S International Microwave Symposium (IMS), May 2016.

Guyette et al., "Switched Allpass-to-Bandstop Absorptive Filters With Constant Group Delay," IEEE Transactions on Microwave Theory and Techniques, vol. 64, No. 8, pp. 2590-2595, Jul. 2016.

Naglich et al., "Switchless Tunable Bandstop-to-All-Pass Reconfigurable Filter," IEEE Transactions on Microwave Theory and Techniques, vol. 60, No. 5, pp. 1258-1265, May 2012.

* cited by examiner

BANDSTOP FILTERS WITH POWER-DEPENDENT STOPBAND ATTENUATION

FIELD OF THE DISCLOSURE

This disclosure relates to filters, including bandstop filters.

BACKGROUND

In electronic circuit systems, unwanted signals can lower the dynamic range of a system or damage it if the power level is high enough. Bandstop filters can be used (e.g., in radio frequency (RF) and microwave systems) to reject unwanted signals from entering a receiver or leaving a transmitter. For example, bandstop filters can be used in RF and microwave systems to remove unwanted signals over a specific frequency range while passing signals with frequencies that fall outside of that range. These unwanted signals can originate from co-site or externally generated interference as well as nonlinear components under high-power excitation in the system.

In applications where manually-switched bandstop filters are used to block expected interference, a delay is used so that the filter can be switched. In applications where they are used reactively to block unexpected interference, there is a processing delay during which the system determines that the filter needs to be switched.

Static and switched bandstop filters can be useful when the schedule and electrical characteristics of unwanted signals is known. However, in many modern scenarios, this information is not known by all of the systems that interact with one another in a given area. In some of these cases, limiters can be used to protect receivers from damaging unwanted signals.

Limiters can be placed into two broad categories: wideband and frequency-selective. Wideband limiters can protect receivers at the cost of attenuating signals at all frequencies, not just at or around frequencies that contain high-power signals. Frequency-selective limiters can provide high attenuation only around frequencies that contain high-power signals. However, previous implementations have other undesirable traits, such as moderately high attenuation of low-power signals. Additionally, frequency-selective limiters are generally not commercially available.

BRIEF DESCRIPTION OF THE DRAWINGS/FIGURES

The accompanying drawings, which are incorporated in and constitute part of the specification, illustrate embodiments of the disclosure and, together with the general description given above and the detailed descriptions of embodiments given below, serve to explain the principles of the present disclosure. In the drawings.

Figure 1:
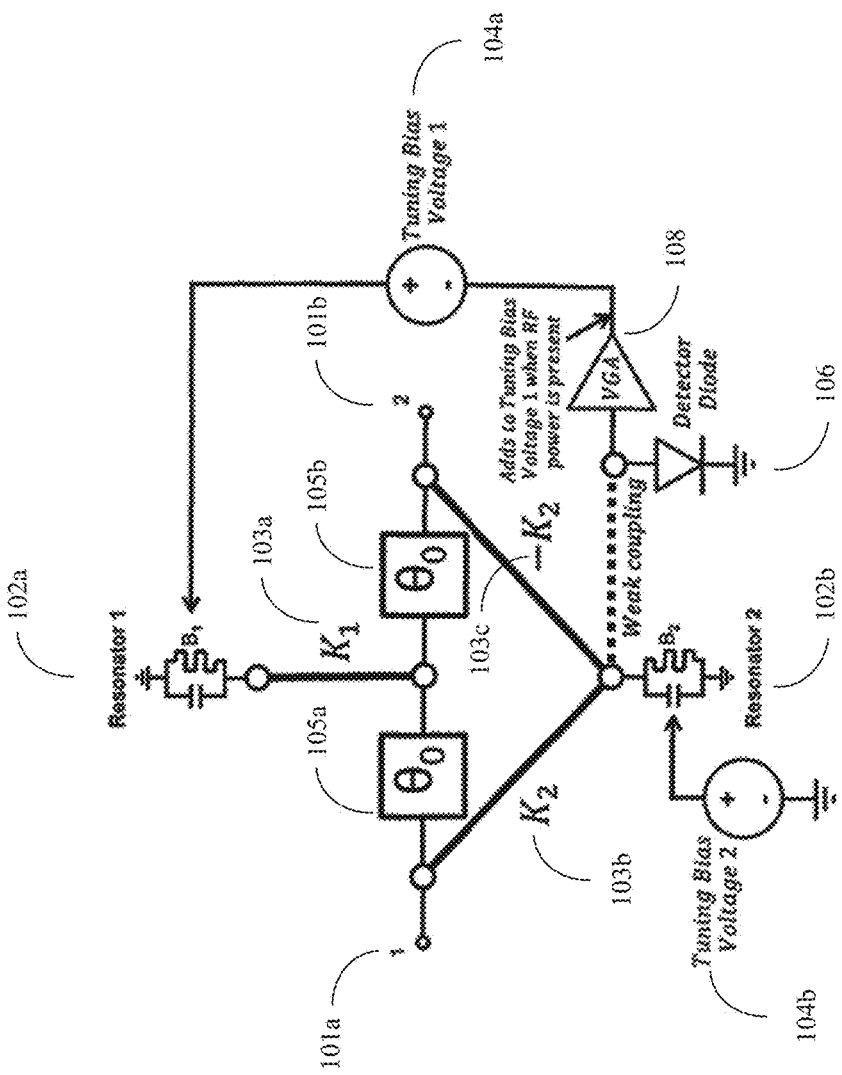
FIG. 1 is a diagram of a circuit for a power-dependent bandstop filter with a two-pole topology that uses a detector diode and voltage amplifier to slightly adjust the center frequency of a resonator in accordance with an embodiment of the present disclosure.

Features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

In the following description, numerous specific details are set forth to provide a thorough understanding of the disclosure. However, it will be apparent to those skilled in the art that the disclosure, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the disclosure.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of this discussion, the term "module" shall be understood to include one of software, or firmware, or hardware (such as circuits, microchips, processors, or devices, or any combination thereof), or any combination thereof. In addition, it will be understood that each module can include one, or more than one, component within an actual device, and each component that forms a part of the described module can function either cooperatively or independently of any other component forming a part of the module. Conversely, multiple modules described herein can represent a single component within an actual device. Further, components within a module can be in a single device or distributed among multiple devices in a wired or wireless manner.

1. Overview

Embodiments of the present disclosure provide systems and methods for implementing a microwave circuit that passes all frequencies when only signals below a power threshold are present and automatically switches in a bandstop response to attenuate signals in a designable bandwidth when signals above the power threshold appear. Filters in accordance with an embodiment of the present disclosure have responses that automatically and continuously reconfigure between an all-pass response and a bandstop response as the power level of signals within their bandwidth changes. This technology allows high power signals within a designable bandwidth to be strongly attenuated while minimally affecting signals in adjacent bandwidths. It also allows low power signals in the designable bandwidth to pass with minimal attenuation.

In an embodiment, a bandstop filter with attenuation that depends on input power level can be used as a narrowband limiter. Additionally, bandstop filters with diverse center frequencies can be cascaded because bandstop filters can be matched to the system impedance at frequencies away from their stopband. A cascade of multiple power-dependent bandstop filters can be used as a frequency-selective limiter, where only the bandstop filters in bands with high power signals provide high attenuation, implementing frequency-equalization functionality.

2. Bandstop Filters with Power-Dependent Stopband Attenuation

Embodiments of the present disclosure provide systems and methods for integrating closed-loop analog electronics and microwave filters to autonomously switch a bandstop filter. In an embodiment, a bandstop filter with power-dependent stopband attenuation in accordance with an embodiment of the present disclosure can include a resonant power sensing and diode-driver circuit and a switchable bandstop filter. In an embodiment, a resonant power sensing and diode-driver circuit can be integrated with the bandstop filter and can sense power only within the bandwidth of the bandstop filter by using additional resonators at the filter center frequency. A switchable bandstop filter in accordance with an embodiment of the present disclosure can be optimized to limit the impact of power-dependence on the quality of the filter response. Previous power-dependent bandstop filter topologies have significantly degraded responses when limiting.

In an embodiment, the sensing circuit senses the power level of signals within the bandstop filter's bandwidth, produces a direct current (DC) voltage with a tunable gain, and switches the bandstop filter if the power level is over a designable threshold. Power sensed at locations in the filters do not change when the state is toggled, allowing for simpler sensing and control. Topologies in accordance with embodiments of the present disclosure remain general enough to support any number of resonators or response shapes. Embodiments of the present disclosure provide closed-loop sensing and switching. In an embodiment, no control signals or digital computation is required, and embodiments of the present disclosure enable faster responses to unexpected interference when compared to conventional devices.

Two exemplary embodiments for switching the bandstop response will now be discussed. In a two pole embodiment, illustrated by way of example in FIG. 1, the voltage present on a resonator can be switched, amplified, and used to slightly tune one of the resonators that contains an electronically-tunable element such as a varactor. In a three pole embodiment, illustrated by way of example with reference to FIG. 3, a power-dependent switched coupling structure can be used.

3. Two Pole Embodiment

FIG. 1 is a diagram of a circuit for a power-dependent bandstop filter with a two-pole topology that uses a detector diode and voltage amplifier to slightly adjust the center frequency of a resonator in accordance with an embodiment of the present disclosure. In an embodiment, port 1 101a is the input to the bandstop filter of FIG. 1, and port 2 101b is the output to the bandstop filter of FIG. 1. The circuit of FIG. 1 includes a first resonator 102a, tuned by tuner 104a (e.g., in an embodiment, a power supply with a tuning bias voltage), and a second resonator 102b, tuned by tuner 104b. In an embodiment, resonator 102a has susceptance $B_1$, and resonator 102b has susceptance $B_2$. In the topology of FIG. 1, resonators 102 are coupled via couplings 103a, 103b, and 103c separated by phase shifts 105a and 105b. While tuners 104 are show in FIG. 1, it should be understood that other tuners can be used to tune resonators 102 in accordance with embodiments of the present disclosure.

In FIG. 1, resonator 102b is weakly coupled to detector diode 106. For example, in an embodiment, this weak coupling can involve placing detector diode 106 close enough to resonator 102b such that detector diode 106 can sense power (e.g., through air between detector diode 106 and resonator 102b) from resonator 102b and generate a voltage based on this sensed power. For example, in an embodiment, detector diode 106 is placed close enough to resonator 102b such that detector diode 106 senses 0.1% of the power (and/or voltage) generated by resonator 102b. In an embodiment, weak coupling can also be obtained by inserting a circuit element, such as an inductor or capacitor, between resonator 102b and detector diode 106.

In an embodiment, detector diode 106 senses the voltage present on resonator 102b (e.g., via the weak coupling shown in FIG. 1), and this sensed voltage is amplified by amplifier 108. The amplified voltage can be used to adjust tuner 104a to tune resonator 102a. In the topology of FIG. 1, slightly detuning one resonator when a high power signal is detected (e.g., slightly detuning resonator 102a based on the amplified signal from amplifier 108) changes the relationship between the two paths through the circuit from constructive interference to destructive interference over the bandwidth of the filter, implementing a bandstop response. In an embodiment, the all-pass to bandstop reconfiguration capability is made to depend on input power level instead of a control voltage.

Figure 2A:
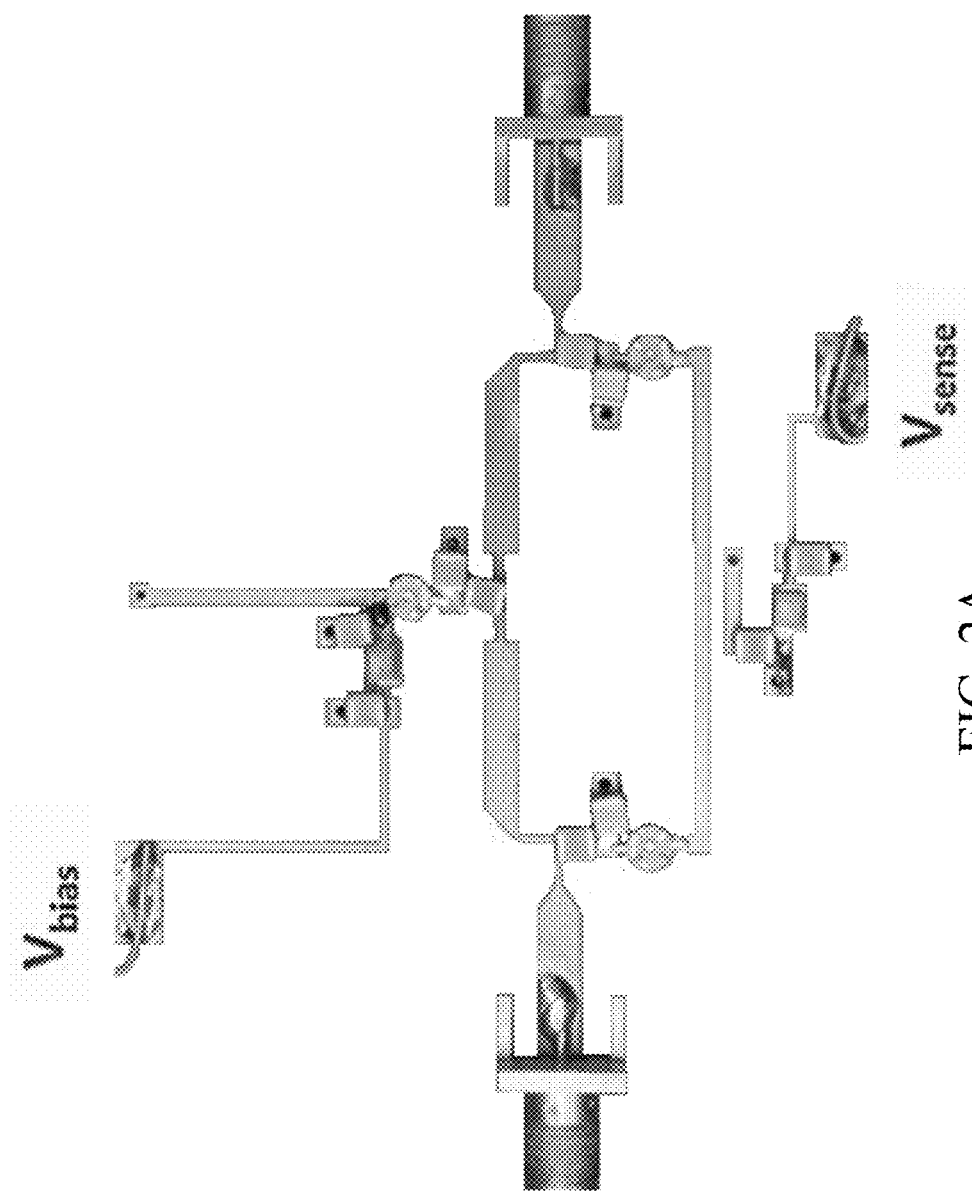
FIG. 2A shows an exemplary fabricated device with a two-pole topology in accordance with an embodiment of the present disclosure.
Figure 2B:
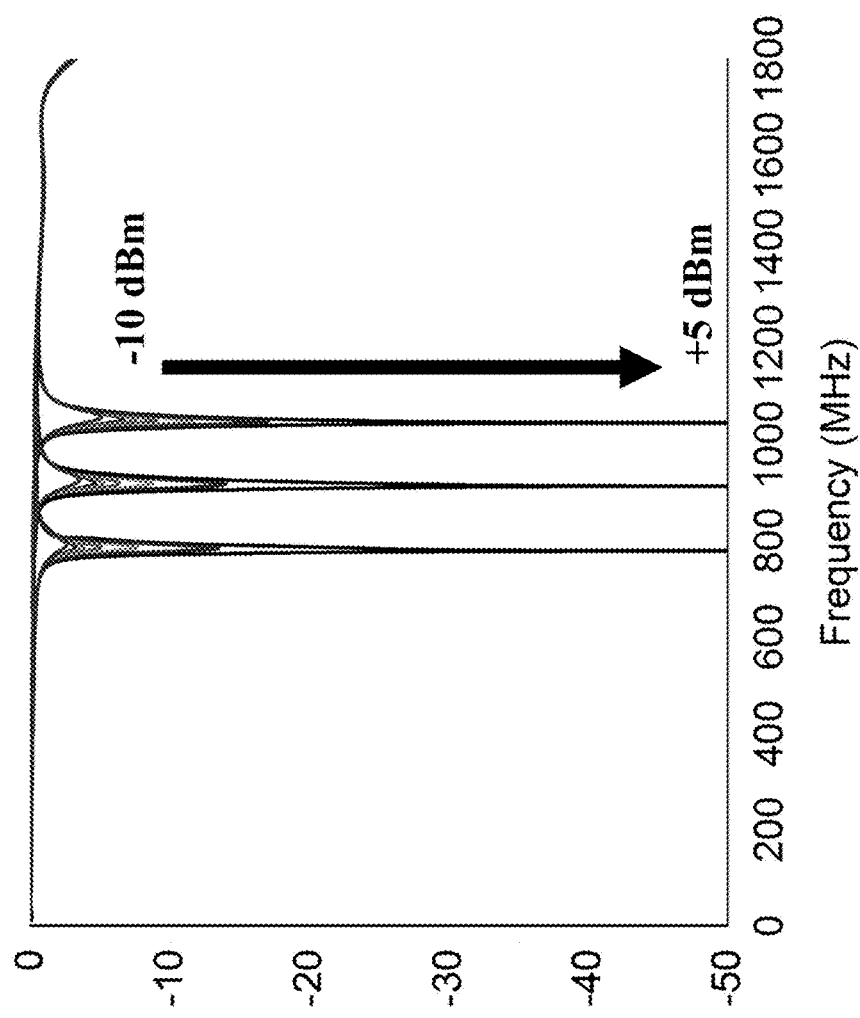
FIG. 2B is a diagram of measured results from the device of FIG. 2A in accordance with an embodiment of the present disclosure.

FIG. 2A shows an exemplary fabricated device with the two-pole topology of FIG. 1 in accordance with an embodiment of the present disclosure. The dual-coupled topology of FIGS. 1 and 2A do not require a third resonator, and the sensor and driver circuit of FIGS. 1 and 2A allow continuous tuning and power activation. FIG. 2B is a diagram of measured results from the device of FIG. 2A in accordance with an embodiment of the present disclosure. From the results of FIG. 2B, it can be seen that the bandstop filter response appears and deepens as input power is increased.

4. Three Pole Embodiment

A three pole embodiment will now be discussed with reference to FIGS. 3A and 3B. The topology of FIGS. 3A and 3B requires a third resonator but is less sensitive than the two resonator topology of FIG. 1.

Figure 3A:
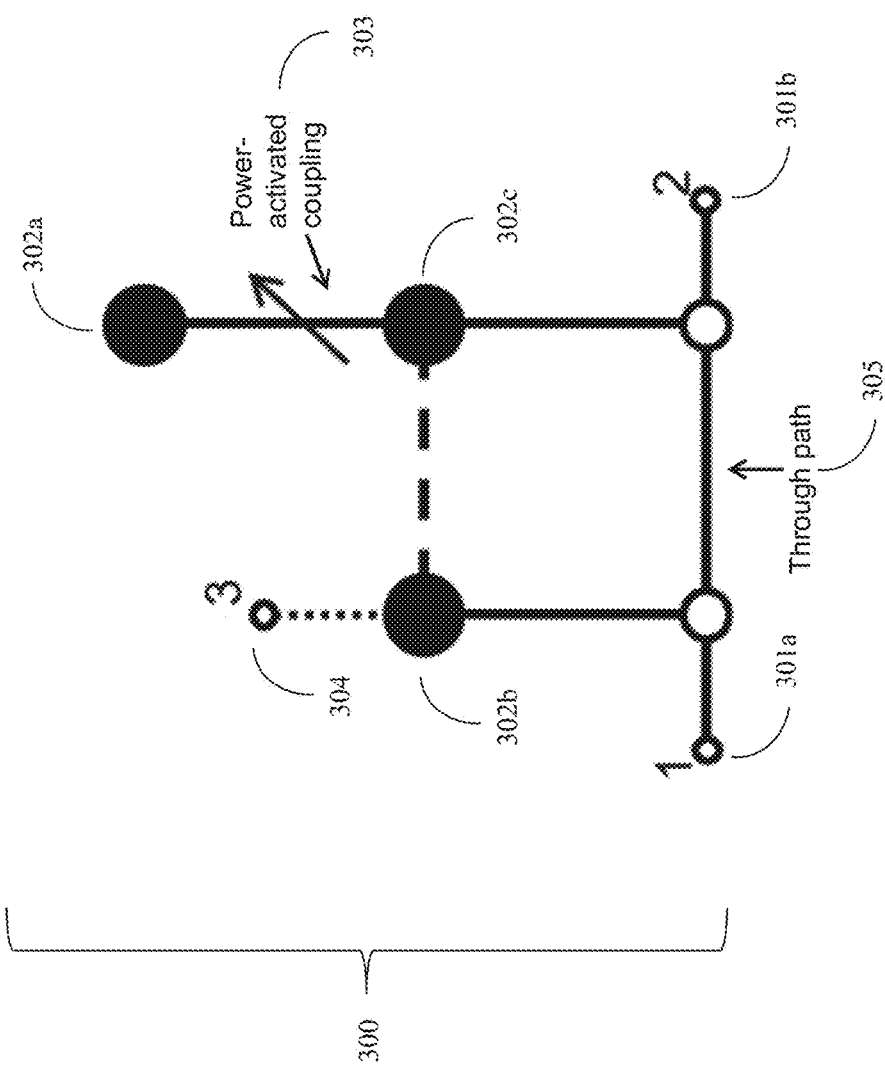
FIG. 3A is a diagram of a circuit for a three pole embodiment of a bandstop filter in accordance with an embodiment of the present disclosure.

FIG. 3A is a diagram of a circuit 300 for a three pole embodiment of a bandstop filter in accordance with an embodiment of the present disclosure. In an embodiment, the input to the circuit of FIG. 3A is at port 1 301a, and the output of the circuit of FIG. 3A is at port 2 301b. In an embodiment, resonators 302b and 302c can be weakly coupled to each other, as shown by the dashed line in FIG. 3A. However, it should be understood that, in accordance with embodiments of the present disclosure, resonators 302b and 302c are not weakly coupled to each other. For example, in an embodiment, resonators 302b and 302c can be strongly (e.g., physically and/or directly) coupled together.

FIG. 3A includes resonators 302a, 302b, and 302c. In FIG. 3A, a weakly-coupled port 304 senses the voltage on resonators 302. In an embodiment, the voltage sensed by weakly-coupled port 304 is independent of the filter state (on or off), so that sensing can be maintained while the filter of FIG. 3A is rejecting a high power signal. This allows the filter of FIG. 3A to turn off when the high-power signal subsides.

In FIG. 3A, signals away from the center frequency of resonators 302 can be passed in through path 305. In an embodiment, both of resonators 302 have the same center frequency. In an embodiment, there are no switches or other control elements in any of the through paths of the filter of FIGS. 1 and 3A. Signals at the center frequency of resonators 302 can either be passed or attenuated depending on the sensed power level. In an embodiment, the power level is sensed at weakly-coupled port 304, and the state of the filter is toggled using the power-activated coupling section 303. In an embodiment, resonator 302a is activated (e.g., switched in) by power-activated coupling 303 when high-power signals are detected to implement a bandstop response. In an embodiment, resonator 302a is not switched into the circuit of FIG. 3A when only low-power signals are present.

Figure 3B:
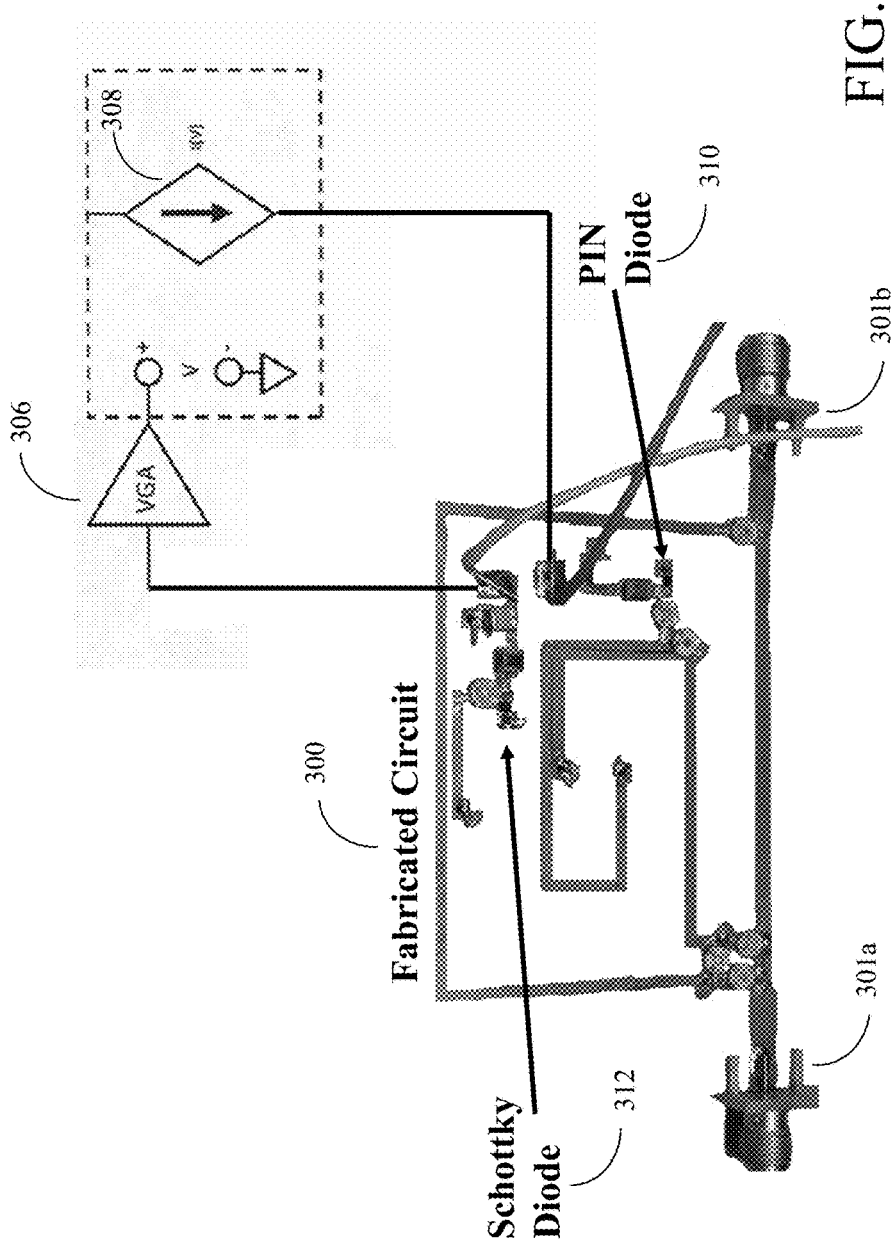
FIG. 3B is a diagram of an embodiment of a circuit with a 3-pole power-dependent bandstop filter utilizing a power-dependent switched coupling structure in accordance with an embodiment of the present disclosure.

FIG. 3B is a diagram of an embodiment of a circuit with a 3-pole power-dependent bandstop filter utilizing a power-dependent switched coupling structure in accordance with an embodiment of the present disclosure. As shown in FIG. 3B, circuit 300 can include additional elements not shown in FIG. 3A in accordance with embodiments of the present disclosure. For example, in FIG. 3B, circuit 300 includes PIN diode 310 and Schottkey diode 312. In an embodiment, Schottkey diode 312 is coupled to weakly-coupled port 304. In an embodiment, PIN diode 310 is part of power-activated coupling 303. In an embodiment, The "P" and "N" in PIN diode 310 reference doped regions, and the "I" is for an undoped intrinsic semiconductor region that is placed between the P and N doped regions. The benefit of the "I" region can vary based on its composition. In an embodiment, PIN diodes are better than regular PN diodes for fast switching, for example.

In FIG. 3B, circuit 300 is shown coupled to a variable gain amplifier (VGA) 306 and a voltage-controlled current source 308. For example, in an embodiment, VGA 306 is coupled to weakly-coupled port 304. In an embodiment, voltage-controlled current source 308 is coupled to power-activated coupling 303 of FIG. 3A. While elements of FIG. 3B (e.g., VGA 306 and voltage-controlled current source 308) are shown outside of circuit 303 in FIG. 3B, it should be understood that in an embodiment, these elements can be incorporated into circuit 300. It should further be understood that, in accordance with embodiments of the present disclosure, amplifiers other than VGAs can be used to amplify the signal from weakly-coupled port 304. Further, it should be understood that, in accordance with embodiments of the present disclosure, no amplifier may be necessary to amplify the signal from weakly-coupled port 304.

In an embodiment, the voltage sensed from resonators 302 by weakly-coupled port 304 is amplified by VGA 306 and fed to voltage-controlled current source 308. When the voltage is sufficiently high, voltage-controlled current source 308 drives a PIN diode 310 in the bandstop filter, changing its response from all-pass to bandstop. While current source 308 is a voltage controlled current source in FIG. 3B, it should be understood that other current sources can be used in accordance with embodiments of the present disclosure. Further, it should be understood that driver circuitry other than current sources can be used to drive PIN diode 310 and or power-activated coupling 303 in accordance with embodiments of the present disclosure.

In an embodiment, the sensor and driver circuit of FIG. 3B allows the bandstop filter to switch at a much lower power level than that in a standard case without such a sensor and driver circuit. In addition, the threshold power that turns on the bandstop response can be tuned by varying the gain of VGA amplifier 306. In the device of FIG. 3B, the added power sensor and driver increase the sensitivity of the power-dependent bandstop filter.

Figure 4A:
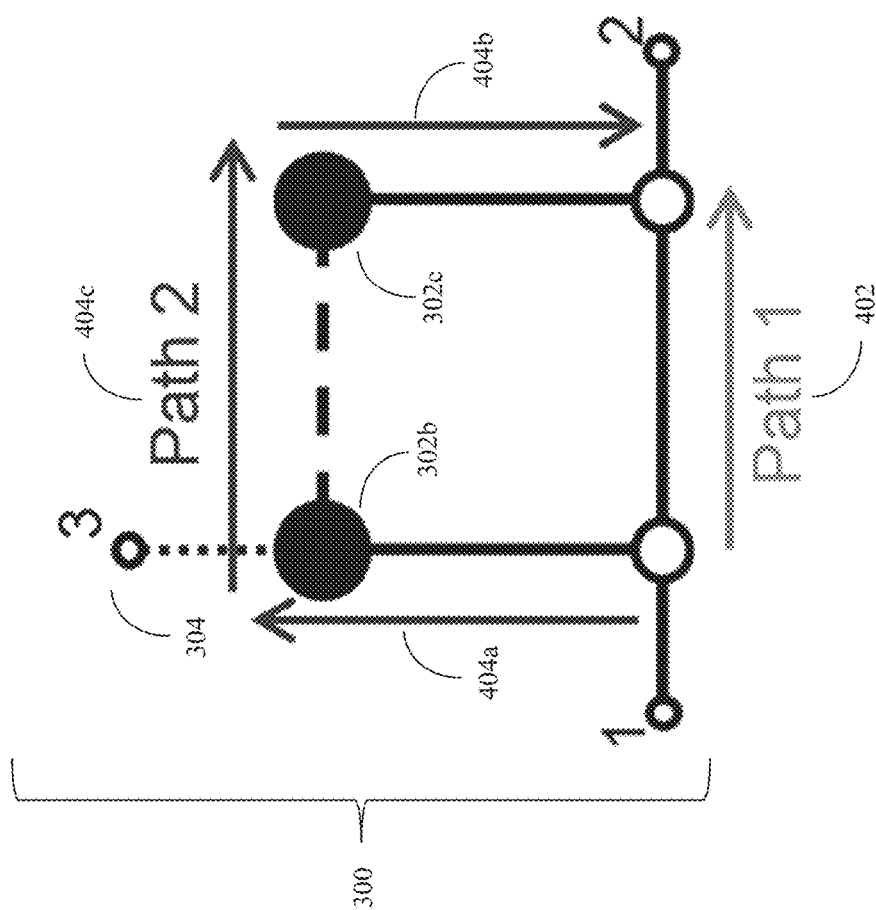
FIG. 4A is a diagram showing signal paths for a low power equivalent circuit of the filter of FIG. 3A in accordance with an embodiment of the present disclosure.
Figure 4B:
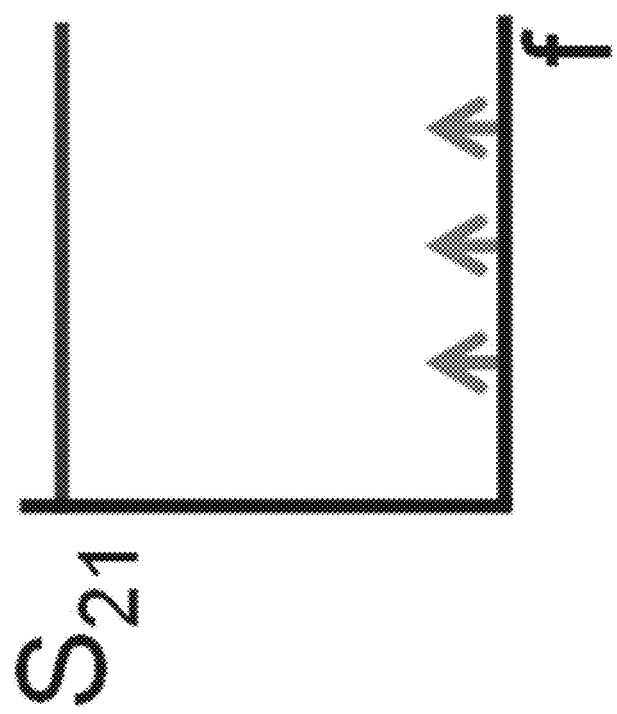
FIG. 4B is a diagram showing an exemplary response of the circuit of FIG. 4A in accordance with an embodiment of the present disclosure.

FIG. 4A is a diagram showing signal paths for a low power equivalent circuit of the filter of FIG. 3A in accordance with an embodiment of the present disclosure. In the low power equivalent circuit of FIG. 4A, signals away from the center frequency of the resonators are passed in Path 1 402. Signals at the center frequency of the resonators are passed through Path 1 402 and Path 2 404, which are designed to constructively interfere at the output. The power level is sensed at weakly-coupled port 304, and the filter waits for high-power signals. FIG. 4B is a diagram showing an exemplary response of the circuit of FIG. 4A in accordance with an embodiment of the present disclosure when only low power signals are present (e.g., signals sufficiently low in power as to not activate the bandstop response via power-activated coupling 303). As shown in FIG. 4B, when only low power signals are present, power-activated coupling 303 is not triggered, and no bandstop response occurs. Thus, all low power signals are passed.

Figure 4C:
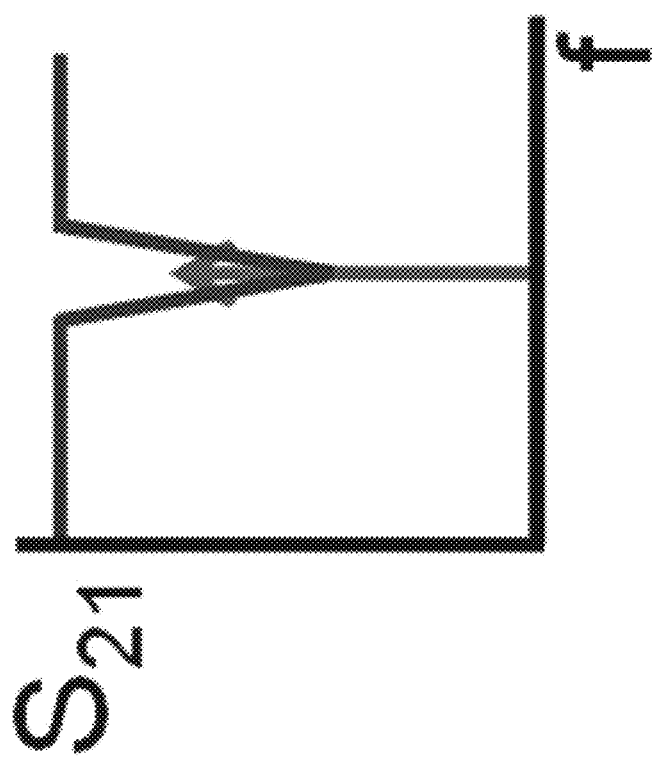
FIG. 4C is a diagram showing an exemplary response of the circuit of FIG. 3A when high power signals are present in accordance with an embodiment of the present disclosure.

When high power signals are present (i.e., signals with power equal to or above a threshold power that is high enough to trigger the bandstop response via power-activated coupling 303), signals away from the center frequency of resonators 302 are passed in Path 1 402, and high-power signals activate power-activated coupling 303, which ruins balance giving constructive interference and implements a bandstop response. Signals at the center frequency of resonators 302 are rejected. FIG. 4C is a diagram showing an exemplary bandstop response of the circuit of FIG. 3A when high power signals are present in accordance with an embodiment of the present disclosure.

In an embodiment, power-activated coupling 303 (which can include PIN diode 310 in accordance with some embodiments of the present disclosure) is configured to provide a continuously variable amount of coupling to resonator 302a based on the power of the input signal (e.g., input to port 1 301a). For example, in embodiment, as the power of the input signal increases, power-activated coupling 303 provides additional coupling to resonator 302a (e.g., until a predefined saturation point at which a maximum coupling to resonator 302a is achieved). In an embodiment, this continuously variable amount of coupling enables more or less suppression of an input high-power signal via a bandstop response. In an embodiment, the ratio of the amount of coupling to the input signal power can be configured (e.g., based on hardware characteristics and/or settings of PIN diode 310 and/or VGA 306).

In an embodiment, when only low power signals are present, two sets of parameters are balanced. The first set of balanced parameters is the impedances and phases of Path 1

402 and Path 2 404 in FIG. 4A. In an embodiment, this balance enables constructive interference and is designed using the parameters of Path 1 402, Path 2 404, and resonators 302, and it ignores power-activated coupling 303 and resonator 302a. The second set of balanced parameters is between the electric and magnetic fields in power-activated coupling 303. In an embodiment, as long as the length of power-activated coupling 303 is not too long relative to the wavelength at the center frequency of the filter, an equal amount of electric and magnetic fields in the coupling structure will cancel each other out and provide approximately zero coupling between resonator 302a and the rest of the circuit. In an embodiment, this condition is designed into the low-power signal state of the filter so that it does not see any effect from resonator 302a. Said another way, in an embodiment, there is an effective open circuit looking into power-activated coupling 303 from the rest of the filter when only low power signals are present.

In an embodiment, once a high power signal appears, and PIN diode 310 in power-activated coupling 303 is switched, the balance of electric and magnetic fields in power-activated coupling 303 is disrupted (e.g., because PIN diode 310 switches in a capacitance that shifts the coupling mechanism of power-activated coupling 303), and significant coupling to resonator 302a appears. This coupling to resonator 302a presents a nonzero impedance to the rest of the filter, where the rest of the filter was designed to have constructive interference between its two paths when this impedance was not present. If designed well, the impedance that appears from switching resonator 302a into the circuit can completely change the response of the rest of the filter to one that has destructive interference between the two paths.

In an embodiment, selecting resonator 302a affects the bandwidth and depth of the response in the high power state, and it does not have an effect on the low power response. In an embodiment, to tune the bandstop band to another frequency range, the center frequency of all three resonators can be tuned to the new frequency.

5. Exemplary Advantages

Embodiments of the present disclosure provide filters that can autonomously switch themselves based on the presence of interference above a defined power threshold, reducing the system delays and digital computation cost associated with conventional manually-switched bandstop filters. No control signals or digital computation is needed to switch filters in accordance with embodiments of the present disclosure or to determine if they need to be switched. Not requiring control signals or digital computation to reconfigure its response makes it easier and cheaper to implement in systems. Bandstop filters in accordance with embodiment of the present disclosure provide an autonomous response that minimally affects the passband so that adjacent signals can pass with low loss.

Embodiments of the present disclosure combine frequency-selective limiting with a tunable limiting threshold, which is not possible with ferrite or magnetic frequency-selective limiters. A cascade of the frequency-selective limiters in accordance with embodiments of the present disclosure can cover wide bandwidths, enabling frequency-selective limiting for more applications. The added sensing and driving circuit allows for very low limiting threshold powers, which is important in systems with low power levels like satellite communications.

6. Exemplary Alternative Embodiments

Embodiments of the present disclosure could potentially be realized with a wide range of technologies (e.g., waveguide, coaxial, Low Temperature Co-Fired Ceramic (LTCC), etc.). A wide range of switches (PIN diodes, field effect transistors (FETs), bipolar junction transistors (BJTs), MicroElectricalMechanical systems (MEMS), phase-change materials, etc.) could be used to enable power-dependent switching. A wide variety of detectors and amplifiers could be used to sense the RF power and drive the switches.

Embodiments of the present disclosure can be implemented using one device or multiple devices in accordance with embodiments of the present disclosure. For example, in an embodiment, the elements of FIG. 1 can be implemented on a single integrated circuit, and the elements of FIG. 3B can be implemented on a single integrated circuit. Further, embodiments of the present disclosure can be implemented using hardware (e.g., circuitry), software, and/or a combination of hardware and software.

7. Conclusion

It is to be appreciated that the Detailed Description, and not the Abstract, is intended to be used to interpret the claims. The Abstract may set forth one or more but not all exemplary embodiments of the present disclosure as contemplated by the inventor(s), and thus, is not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

While various embodiments of the present disclosure have been described above, it should be understood that they have been presented by way of example only, and not limitation. It will be apparent to persons skilled in the relevant art that various changes in form and detail can be made therein without departing from the spirit and scope of the disclosure. Thus, the breadth and scope of the present disclosure should not be limited by any of the above-described exemplary embodiments.

What is claimed is:

1. A bandstop filter, comprising:
a first resonator, coupled to a first port and weakly coupled to a second port;
a variable gain amplifier (VGA) coupled to the second port;
a second resonator, coupled to a third port and a power-activated coupling; and
a third resonator, coupled to the power-activated coupling, wherein the power-activated coupling is configured to couple the third resonator to the second resonator when a high power signal is input into the first port.

2. The bandstop filter of claim 1, wherein coupling the second resonator to the third resonator generates a bandstop response for the high power signal.

3. The bandstop filter of claim 1, wherein the second resonator and the third resonator remain uncoupled when only low power signals are input into the first port.

4. The bandstop filter of claim 1, wherein the power-activated coupling includes a PIN diode.

5. The bandstop filter of claim 1, further comprising a Schottkey diode coupled to the second port.

6. The bandstop filter of claim 1, wherein the first resonator is weakly coupled to the second resonator.

7. The bandstop filter of claim 1, further comprising a current source, coupled to the VGA, configured to activate the power-activated coupling when the high power signal is input into the first port.

8. A bandstop filter, comprising:
   a first resonator, coupled to a first port and weakly coupled to a second port;
   a variable gain amplifier (VGA) coupled to the second port;
   a second resonator, coupled to a third port and a power-activated coupling;
   a third resonator, coupled to the power-activated coupling; and
   a driver circuit, coupled to the second port, wherein the driver circuit is configured to:
      detect a signal from the second port, and
      drive the power-activated coupling to couple the second resonator to the third resonator if the signal is above a predetermined power threshold.

9. The bandstop filter of claim 8, wherein the power-activated coupling is configured to couple the third resonator to the second resonator when a high power signal is input into the first port.

10. The bandstop filter of claim 9, further comprising a current source, coupled to the VGA, configured to activate the power-activated coupling when the high power signal is input into the first port.

11. The bandstop filter of claim 8, wherein the driver circuit does not drive the power-activated coupling when the driver circuit detects only low power signals from the second port.

12. The bandstop filter of claim 8, wherein the power-activated coupling includes a PIN diode.

13. The bandstop filter of claim 8, further comprising a Schottkey diode coupled to the second port.

14. The bandstop filter of claim 8, wherein the first resonator is weakly coupled to the second resonator.

15. The bandstop filter of claim 8, wherein the first resonator is directly coupled to the second resonator.

16. The bandstop filter of claim 8, wherein coupling the second resonator to the third resonator generates a bandstop response for high power signals contained in the signal.

17. A bandstop filter, comprising:
   a first resonator, coupled to a tuner;
   a second resonator, coupled to the first resonator; and
   a detector, coupled to the tuner and weakly coupled to the second resonator, wherein the detector is configured to:
      sense a voltage present on the second resonator, and
      adjust the tuner to detune the first resonator if the voltage indicates that a high-power signal is present.

18. The bandstop filter of claim 17, further comprising an amplifier coupled to an output of the detector and to an input of the tuner.

19. The bandstop filter of claim 17, wherein the detector is a detector diode.

20. The bandstop filter of claim 17, wherein the detector is configured to adjust the tuner to implement a bandstop response for the bandstop filter.

* * * * *